(12) United States Patent
Luo et al.

(10) Patent No.: US 12,272,530 B2
(45) Date of Patent: Apr. 8, 2025

(54) ULTRA-LARGE AREA SCANNING REACTIVE ION ETCHING MACHINE AND ETCHING METHOD THEREOF

(71) Applicant: The Institute of Optics and Electronics, The Chinese Academy of Sciences, Chengdu (CN)

(72) Inventors: Xiangang Luo, Chengdu (CN); Zeyu Zhao, Chengdu (CN); Yanqin Wang, Chengdu (CN); Ping Gao, Chengdu (CN); Xiaoliang Ma, Chengdu (CN); Mingbo Pu, Chengdu (CN); Xiong Li, Chengdu (CN); Yinghui Guo, Chengdu (CN)

(73) Assignee: The Institute of Optics and Electronics, The Chinese Academy of Sciences, Sichuan (CN)

( * ) Notice: Subject to any disclaimer, the term of this patent is extended or adjusted under 35 U.S.C. 154(b) by 626 days.

(21) Appl. No.: 17/418,635

(22) PCT Filed: Dec. 29, 2018

(86) PCT No.: PCT/CN2018/125568
§ 371 (c)(1),
(2) Date: Jun. 25, 2021

(87) PCT Pub. No.: WO2020/133401
PCT Pub. Date: Jul. 2, 2020

(65) Prior Publication Data
US 2022/0068617 A1    Mar. 3, 2022

(30) Foreign Application Priority Data

Dec. 27, 2018  (CN) .......................... 201811610204.1

(51) Int. Cl.
*H01J 37/32*        (2006.01)

(52) U.S. Cl.
CPC .. *H01J 37/32733* (2013.01); *H01J 37/32018* (2013.01); *H01J 37/32513* (2013.01); *H01J 37/32724* (2013.01); *H01J 2237/3341* (2013.01)

(58) Field of Classification Search
CPC ............ H01L 21/68764; H01L 21/6776; H01J 37/32018; H01J 37/32899;
(Continued)

(56) References Cited

U.S. PATENT DOCUMENTS 4,480,585 A * 11/1984 Gattuso ................. C23C 16/545
                                                        136/258
2004/0065255 A1 * 4/2004 Yang ................. C23C 16/45551
                                                        118/715
(Continued)

FOREIGN PATENT DOCUMENTS

CN       1637613 A       7/2005
CN       1961401 A       5/2007
(Continued)

OTHER PUBLICATIONS

Extended European Search Report in European Appln No. 18944176. 9, dated Aug. 31, 2022, 8 pages.
(Continued)

*Primary Examiner* — Yuechuan Yu
(74) *Attorney, Agent, or Firm* — Fish & Richardson P.C.

(57) ABSTRACT

The present disclosure relates to a field of dry etching technology. The present disclosure provides an ultra-large area scanning reactive ion etching machine and an etching method thereof. The ultra-large area scanning reactive ion etching machine includes: an injection chamber, an etching reaction chamber, a transition chamber, and an etching ion generation chamber. By moving a sample holder among the injection chamber, the etching reaction chamber and the
(Continued)

transition chamber in a scanning direction, a scanning etching is performed on a sample placed on the sample holder, which may realize a large-area, uniform and efficient etching.

15 Claims, 4 Drawing Sheets

(58) Field of Classification Search
CPC ......... H01J 37/32733; H01J 37/32357; H01J 37/32752; H01J 37/32513; H01J 37/32724; H01J 2237/3341
See application file for complete search history.

(56) References Cited

U.S. PATENT DOCUMENTS

| | | | | |
|---|---|---|---|---|
| 2004/0067641 | A1* | 4/2004 | Yudovsky | C23C 16/45551 438/681 |
| 2011/0174775 | A1* | 7/2011 | Umeoka | H01J 37/32449 118/729 |
| 2012/0225195 | A1* | 9/2012 | Yudovsky | C23C 16/45551 427/58 |
| 2015/0055128 | A1 | 2/2015 | Wolters et al. | |
| 2017/0025252 | A1 | 1/2017 | Liang et al. | |

FOREIGN PATENT DOCUMENTS

| | | |
|---|---|---|
| CN | 201924072 U | 8/2011 |
| CN | 102592931 A | 7/2012 |
| CN | 105849309 A | 8/2016 |
| CN | 108063107 A | 5/2018 |
| CN | 101276010 A | 10/2018 |
| CN | 108682637 A | 10/2018 |
| JP | 4614863 B2 | 1/2011 |
| JP | 2012154846 A | 8/2012 |
| JP | 2017199603 A | 11/2017 |

OTHER PUBLICATIONS

Chinese International Search Report in International Application No. PCT/CN2018/125568, with English Translation, dated Sep. 26, 2019, 4 pages.
Chinese Office Action in Chinese Patent Application No. 201811610204. 1, with English Translation, dated Dec. 21, 2020, 13 pages.

* cited by examiner

ULTRA-LARGE AREA SCANNING REACTIVE ION ETCHING MACHINE AND ETCHING METHOD THEREOF

CROSS REFERENCE TO RELATED APPLICATIONS

This application is a U.S. National Phase application under 35 U.S.C. § 371 of International Application No. PCT/CN2018/125568, filed on Dec. 29, 2018, which claims priority to Chinese Patent Application No. 201811610204.1 entitled "ULTRA-LARGE AREA SCANNING TYPE REACTIVE ION ETCHING MACHINE AND ETCHING METHOD", filed on Dec. 27, 2018, the content of which is incorporated herein by reference in its entirety.

TECHNICAL FIELD

The present disclosure relates to a field of dry etching technology, and in particular to an ultra-large area scanning reactive ion etching machine and an etching method thereof.

BACKGROUND

Semiconductor manufacturing industry and LCD panel manufacturing industry require a large-area and high-resolution etching transfer system. The commonly used high-resolution transfer process is dry etching. Dry etching technology refers to a method of removing substances by using a chemical reaction activated by plasma or by using a high-energy particle beam. According to the mechanism of etching, the dry etching technology may be divided into physical etching, chemical etching, and chemical-physical etching. The chemical-physical etching has advantages of both the physical etching and the chemical etching. It not only has fast etching rate, good selection ratio and etching directivity, but also avoids device damage caused by the high-energy ion beam (which has an extremely high temperature) when only the physical etching is used. Moreover, an etching profile thereof may be changed from isotropic to anisotropic by adjusting plasma conditions and gas composition and the like. Therefore, it is used in most dry etching processes. The chemical-physical etching mainly includes Reactive Ion Etching (RIE), Inductively Coupled Plasma Etching (ICPE), Reactive Ion Beam Etching (RIBE) and the like.

After an etching area of the existing reactive ion etching (RIE) apparatus is increased (with a diameter of more than 500 mm), problems of uneven etching gas distribution, and poor stability and consistency occur, and it is also difficult to achieve uniform etching transfer of large-area micro-nano structure patterns. In the traditional RIE apparatus, positions of a plate electrode and a substrate are fixed during the etching process. Therefore, strict requirements are put forward on the etching gas distribution during the entire etching process, that is, a gas concentration at each point in the large-area etching area must be strictly consistent and be stable for a long time. However, under an influence of a gas diffusion delay effect in a large cavity, residual reactive gas in the etching is detained in the etching area, and it is difficult to form a dynamically balanced large-area uniform gas composition, resulting in a large difference in the etching rate between an edge and a center of the substrate (an etching rate deviation reaches 20%~30% within 1 hour). Theoretical analysis shows that when the etching area is further increased to more than 800 mm in diameter, the etching unevenness even exceeds 50%.

IBE/RIBE has problems such as low etching rate (10~80 nm/min), high surface temperature of adhesive layer, low etching selection ratio (close to 1:1), rough surface after etching, and ion source corrosion by the etching reactive gas, etc. It is also difficult to be used in an accurate three-dimensional surface shape transfer of a continuous surface shape diffraction structure of a large-area photoresist. Although the KZ-400 scanning ion beam etching device developed by the National Synchrotron Radiation Laboratory of the University of Science and Technology of China may also etch a series of large-size diffractive optical elements, it requires a high-precision ion source, resulting in high costs and high technical requirements, and is thus difficult for large-scale popularization and use. In addition, it is difficult to etch patterns on a thin film base substrate due to energy of the ion beam is too high.

SUMMARY

According to one aspect of the present disclosure, an ultra-large area scanning reactive ion etching machine is provided, including: an injection chamber configured to inject a sample, withdraw the sample, and buffer an etching process; an etching reaction chamber downstream of the injection chamber and configured to etch a reaction cavity of the sample; a transition chamber downstream of the etching reaction chamber and configured to buffer the etching process; an etching ion generation chamber in communication with the etching reaction chamber and configured to generate etching ions or plasma and introduce the etching ions or plasma to the etching reaction chamber, wherein the etching reaction chamber is connected to the injection chamber and the transition chamber through channels; wherein the sample is placed on a sample holder which is configured to move in a scanning direction among the injection chamber, the etching reaction chamber and the transition chamber, and the sample is etched by using the etching ions or plasma in the etching reaction chamber; and wherein a size of the channel in a horizontal direction perpendicular to the scanning direction is configured to allow the sample to pass through but is much smaller than a size of the reaction chamber in the horizontal direction perpendicular to the scanning direction.

Optionally, the etching ion generation chamber is arranged on the reaction chamber and is configured to introduce the etching ions or plasma generated in the etching ion generation chamber to the etching reaction chamber.

Optionally, the etching ion generation chamber is a discharge chamber for glow discharge so as to generate reactive ions or plasma for etching. Optionally, the discharge chamber includes an upper cover plate provided with an air inlet, the discharge chamber is in communication with an air supply device through the air inlet, and a lower portion of the discharge chamber is connected to the etching reaction chamber through an extraction grid with pores.

Optionally, the etching ion generation chamber is an inductively coupled plasma generation chamber configured to generate inductively coupled plasma for etching.

Optionally, the sample holder is configured to make a uniform rectilinear reciprocating motion.

Optionally, a speed of the uniform rectilinear reciprocating motion of the sample holder in the scanning direction is adjustable.

Optionally, vacuum locks are provided between the etching reaction chamber and the injection chamber as well as between the etching reaction chamber and the transition chamber.

Optionally, the etching ion generation chamber and the etching reaction chamber are further connected to a vacuum device to realize and maintain a vacuum state in the etching ion generation chamber and the etching reaction chamber.

Optionally, the size of the channel is configured to allow the sample to pass through, and a vertical distance between a top of the channel and a surface of the sample is less than 1/10 of a size of the reaction chamber in the vertical direction. For example, the reaction chamber of the ultra-large area scanning reactive ion etching machine has an internal height of 100 mm, and the channel has a height of less than 10 mm in a direction perpendicular to the surface of the sample.

Optionally, in the horizontal direction perpendicular to the scanning direction, a size of the injection chamber and/or a size of the transition chamber is greater than or equal to a size of the channel.

Optionally, a length of the etching reaction chamber in the horizontal direction perpendicular to the scanning direction is greater than a length of the sample holder in the horizontal direction perpendicular to the scanning direction, and a length of the reaction chamber in a direction parallel to the scanning direction is less than a length of the sample holder in the direction parallel to the scanning direction.

Optionally, the sample holder is arranged on a robot controlled mobile system.

Optionally, a cooling system is provided in the injection chamber, the cooling system is allowed to take contact with the sample holder to cool the sample.

Optionally, a micro efficient cooling system is embedded on a back of the sample holder so as to cool the sample during the entire scanning etching process.

According to another aspect of the present disclosure, an etching method of the ultra-large area scanning reactive ion etching machine described above is provided, including: placing the sample on the sample holder and putting them into the injection chamber entirely; vacuuming the etching ion generation chamber and the etching reaction chamber and generating etching ions or plasma; moving the sample holder carrying the sample from the injection chamber toward the transition chamber in the scanning direction after the etching ions or plasma are generated stably for a period of time and etching the sample in the etching reaction chamber during the moving; returning the sample holder toward the injection chamber in the scanning direction after the sample holder reaches the transition chamber and further etching the sample in the etching reaction chamber during the returning; and completing an etching cycle until the sample holder is returned to an initial position in the injection chamber.

DETAILED DESCRIPTION OF EMBODIMENTS

The present disclosure will be described in detail below with reference to the drawings and specific embodiments. However, the scope of protection of the present disclosure is not limited to the following embodiments and should include all the content in the claims. Moreover, those skilled in the art may realize all the content in the claims from an embodiment described below.

Aiming at the shortcomings of the related art such as small processing area, slow etching rate, low resolution, poor stability, and so on, an ultra-large area scanning reactive ion etching machine is provided to perform a scanning etching on a sample so as to achieve a large-area, uniform and efficient etching. Specifically, the dry etching apparatus may be a reactive ion etching machine, or an inductively coupled plasma etching machine, or the like. Large area means that the sample etching area may be at least 500 mm×500 mm, uniform means that the etching uniformity is not more than ±5%, and efficient means that the etching rate may reach 1 μm/min.

The embodiments of the present disclosure will be described in detail below with reference to the drawings. FIG. 1 to FIG. 5 show schematic structural diagrams of an ultra-large area scanning reactive ion etching machine according to the embodiments of the present disclosure.

Figure 1:
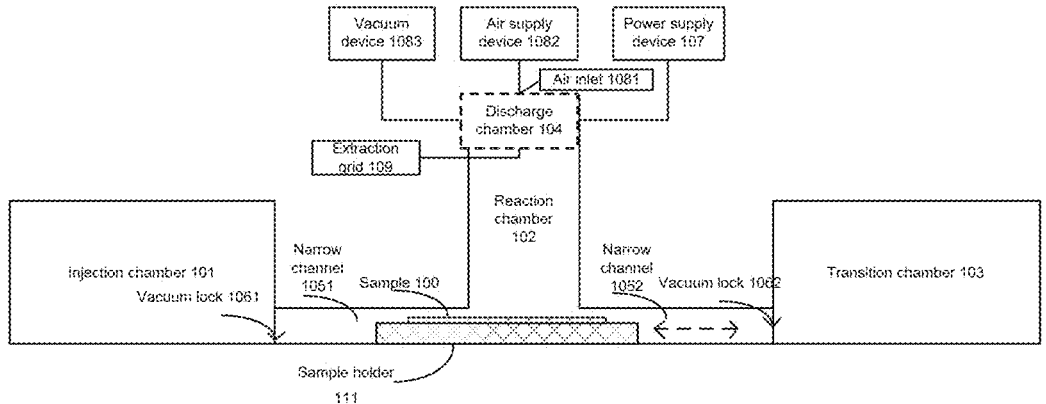
FIG. 1 shows a schematic structural diagram of an ultra-large area scanning reactive ion etching machine according to an embodiment of the present disclosure.

As shown in FIG. 1, the ultra-large area scanning reactive ion etching machine according to an embodiment of the present disclosure includes: an injection chamber (101) used to inject a sample, withdraw the sample and buffer an etching; an etching reaction chamber (102) downstream of the injection chamber, and is a reaction cavity used to etch the sample; a transition chamber (103) downstream of the etching reaction chamber and used to buffer the etching process; a discharge chamber (104) (that is, an etching ion generation chamber) in communication with the etching reaction chamber and used to generate etching ions and introduce the etching ions to the etching reaction chamber (102) (specifically, for glow discharge so as to generate plasma). The etching reaction chamber (102) is connected to the injection chamber (101) and the transition chamber (103) through narrow channels (105-1, 105-2). A sample (100) is placed on a sample holder (111) that is movable in a scanning direction among the injection chamber (101), the etching reaction chamber (102) and the transition chamber (103), and the sample is etched by using the etching ions (for example, reactive etching by using plasma) in the etching reaction chamber (102). A size of the narrow channel in a horizontal direction perpendicular to the scanning direction is configured to allow the sample to pass through but is much smaller than a size of the reaction chamber in the horizontal direction perpendicular to the scanning direction.

The narrow channel is used to inhibit the glow from entering the injection chamber and the transition chamber, so as to ensure an uniformity of the scanning etching. Geometric dimensions (length, width, height) of the narrow channel are designed to not only allow the sample holder and the sample to pass through, but also ensure that the glow may not enter the injection chamber and the transition chamber. The narrow channel functions to limit a diffusion of the glow. During the reactive ion etching, a height from a surface of the sample to a top of the narrow channel is much smaller than a height from the surface of the sample to a top of the reaction chamber. A height of the narrow channel is very small, and an upper cavity wall, a lower cavity wall and side walls of the narrow channel have the same potential, so that the narrow channel may not meet the requirements of glow discharge, and the glow in the narrow channel is interrupted. Therefore, the sample is not etched in the narrow channel. This ensures that only a part of the sample exposed in the reaction chamber is etched. A small volume of the reaction chamber is determined by a scanning manner of the scanning etching itself. The scanning etching may reduce a scale in the scanning direction by using integral properties in the scanning direction, thereby reducing the volume of the reaction chamber compared with the related art in which the reaction chamber covers a surface area of the entire sample. By using an ultra-long length of the narrow channel in the scanning direction and an extreme aspect ratio of the narrow channel, the generation of glow in the narrow channel is prevented.

For example, the size of the narrow channel in the direction perpendicular to the scanning direction is only slightly greater than the size of the sample holder plus the size of the sample, and is much less than the size of the narrow channel in the scanning direction. For example, the narrow channel has a total size of 10 mm in the direction perpendicular to the scanning direction, and a total length of 1000 mm in the scanning direction. The specific requirement is that the glow is not generated in the narrow channel. The size of the narrow channel is configured to allow the sample to pass through, but a vertical distance between the top of the narrow channel and the surface of the sample is less than $1/10$ of the size of the reaction chamber in the vertical direction. For example, the reaction chamber of the ultra-large area scanning reactive ion etching machine has an internal height of 100 mm, and the narrow channel has a height of less than 10 mm in the direction perpendicular to the surface of the sample.

In addition, in the direction perpendicular to the scanning direction, a size of the injection chamber (101) and/or the transition chamber (103) is greater than or equal to the size of the narrow channel (1051, 1052).

Optionally, the etching ion generation chamber (104) is arranged on the reaction chamber (102) and is used to introduce the etching ions or plasma generated in the etching ion generation chamber (104) to the etching reaction chamber (102).

Optionally, the etching ion generation chamber (104) may be a discharge chamber for glow discharge so as to generate reactive ions for etching. The discharge chamber (104) includes an upper cover plate provided with an air inlet (1081), the discharge chamber (104) is in communication with an air supply device (1082) through the air inlet (1081), and a lower portion of the discharge chamber (104) is connected to the etching reaction chamber (102) through an extraction grid (109) with pores. Specifically, an outer wall of the discharge chamber (104) may be surrounded by a copper strip electrode, and a radio frequency power supply (for example, a power supply device 107) is connected to the copper strip electrode for glow discharge so as to generate plasma. The upper cover plate of the discharge chamber is provided with the air inlet, and the lower portion of the discharge chamber is connected to the reaction chamber by the extraction grid with pores, so as to introduce the plasma to the reaction chamber. The sample holder may make a uniform rectilinear reciprocating motion in the scanning direction among the injection chamber, the etching reaction chamber and the transition chamber, so as to perform scanning etching on the sample.

Optionally, the etching ion generation chamber (104) may be an inductively coupled plasma generation chamber used to generate inductively coupled plasma for etching.

Optionally, the sample holder (111) may make a uniform rectilinear reciprocating motion. Optionally, a speed of the uniform rectilinear reciprocating motion of the sample holder (111) in the scanning direction is adjustable.

Optionally, vacuum locks (1061, 1062) are provided between the etching reaction chamber (102) and the injection chamber (101) as well as between the etching reaction chamber (102) and the transition chamber (103). Specifically, the vacuum lock is used to ensure that the reaction chamber is still in a high vacuum after the injection chamber is filled with atmosphere. That is, during the reaction etching process, the injection chamber and the transition chamber are vacuum-isolated from the reaction chamber as much as possible. During the etching, the injection chamber is vacuumed to a high vacuum, then the vacuum lock is opened, and the sample is moved to perform the scanning etching.

Optionally, the etching ion generation chamber (104) and the etching reaction chamber (102) are further connected to a vacuum device (1083) to realize and maintain a vacuum state in the etching ion generation chamber (104) and the etching reaction chamber (102).

Optionally, the length of the etching reaction chamber (102) in the direction perpendicular to the scanning direction is greater than the length of the sample holder (111) in the direction perpendicular to the scanning direction, and a length of the reaction chamber (102) in the direction parallel to the scanning direction is less than a length of the sample holder (111) in the direction parallel to the scanning direction.

Figure 2:
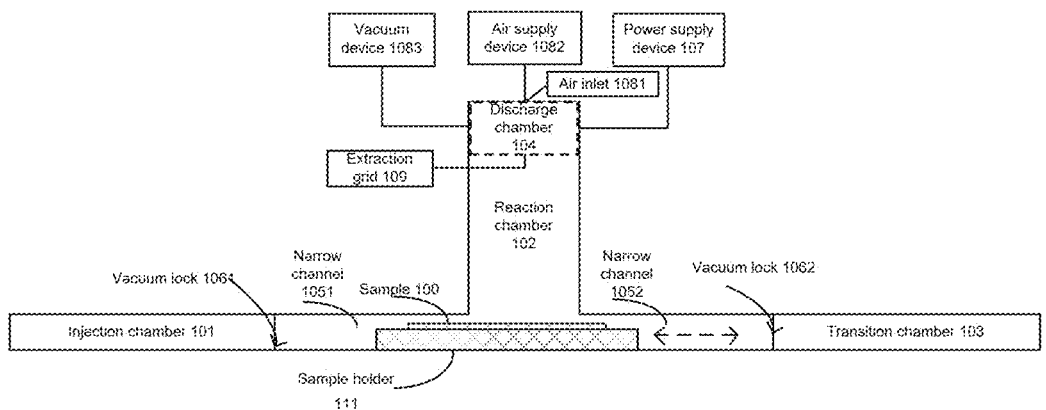
FIG. 2 shows a schematic structural diagram of an ultra-large area scanning reactive ion etching machine according to another embodiment of the present disclosure.

As shown in FIG. 2, in the scanning reactive ion etching machine according to the embodiments of the present disclosure, in the direction perpendicular to the scanning direction, a size of the injection chamber (101) and/or the size of the transition chamber (103) is greater than or equal to a size of the narrow channel (1051, 1052). The small sizes of the injection chamber, the narrow channel and the transition chamber in the direction perpendicular to the scanning direction further reduces a volume of the cavity that needs to be vacuumed.

Optionally, the length of the etching reaction chamber (102) in the direction perpendicular to the scanning direction is greater than the length of the sample holder (111) in the direction perpendicular to the scanning direction, and the length of the etching reaction chamber (102) in the direction parallel to the scanning direction is less than the length of the sample holder (111) in the direction parallel to the scanning direction. The sample holder may entirely accommodate the entire sample, and both the injection chamber and the transition chamber may entirely accommodate the entire sample holder.

Figure 3:
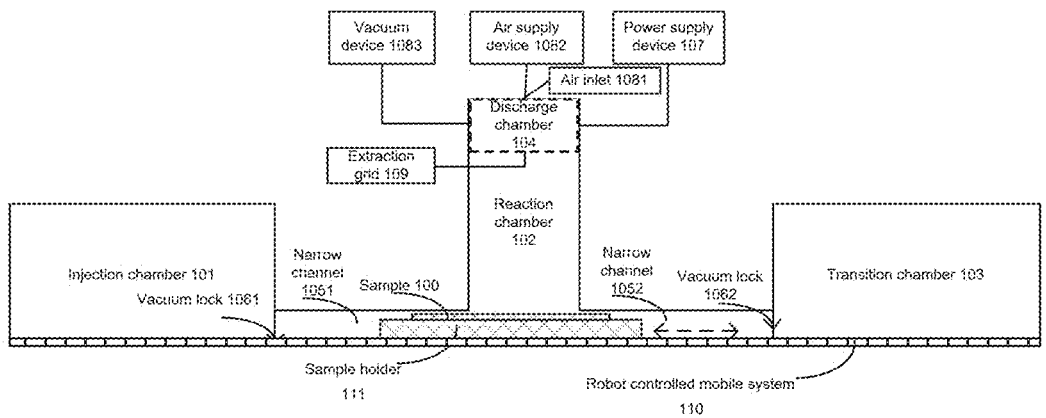
FIG. 3 shows a schematic structural diagram of an ultra-large area scanning reactive ion etching machine according to another embodiment of the present disclosure.

As shown in FIG. 3, the sample holder (111) is arranged on a robot controlled mobile system (110). With a movement of the robot controlled mobile system (110), a duration of the surface of the sample (100) contacts the reaction in the reaction chamber may be controlled, thereby realizing the scanning etching.

Figure 4:
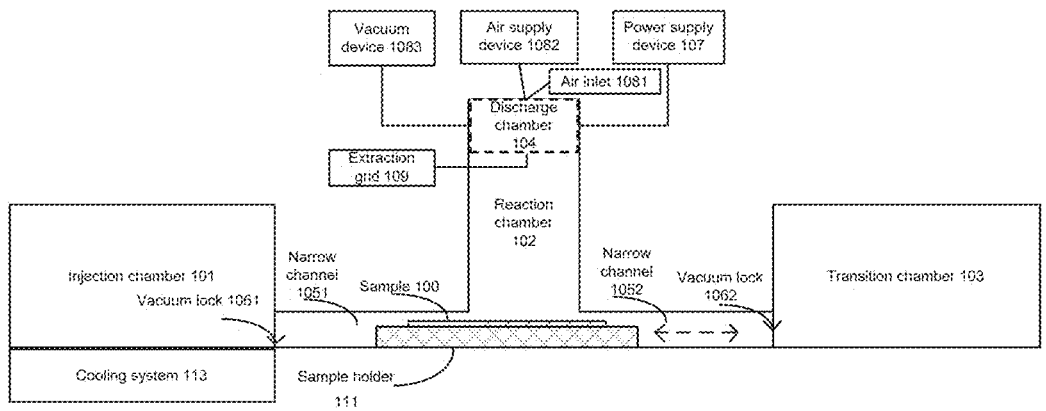
FIG. 4 shows a schematic structural diagram of an ultra-large area scanning reactive ion etching machine according to another embodiment of the present disclosure.

As shown in FIG. 4, a cooling system (113) is provided in the injection chamber (101). The cooling system (1013) may be in contact with the sample holder (111) to cool the sample (100).

Figure 5:
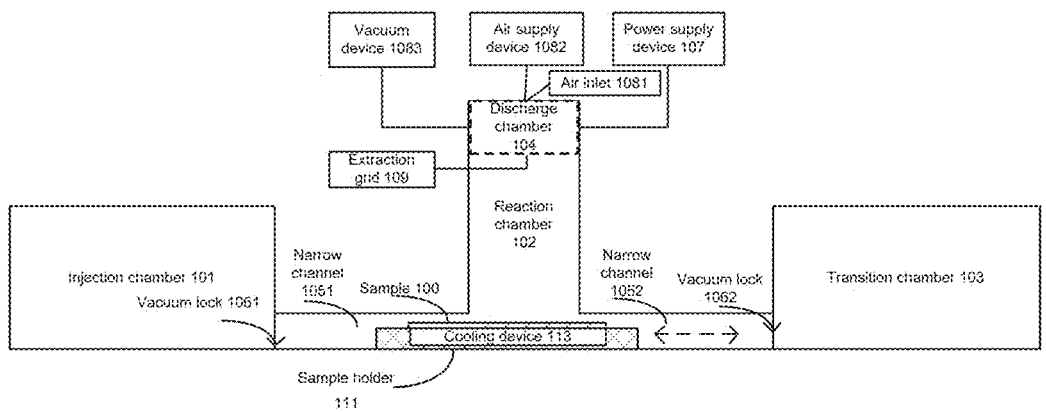
FIG. 5 shows a schematic structural diagram of an ultra-large area scanning reactive ion etching machine according to another embodiment of the present disclosure.

As shown in FIG. 5, an micro efficient cooling system is embedded on a back of the sample holder (111) so as to cool the sample during the entire scanning etching process.

Figure 6:
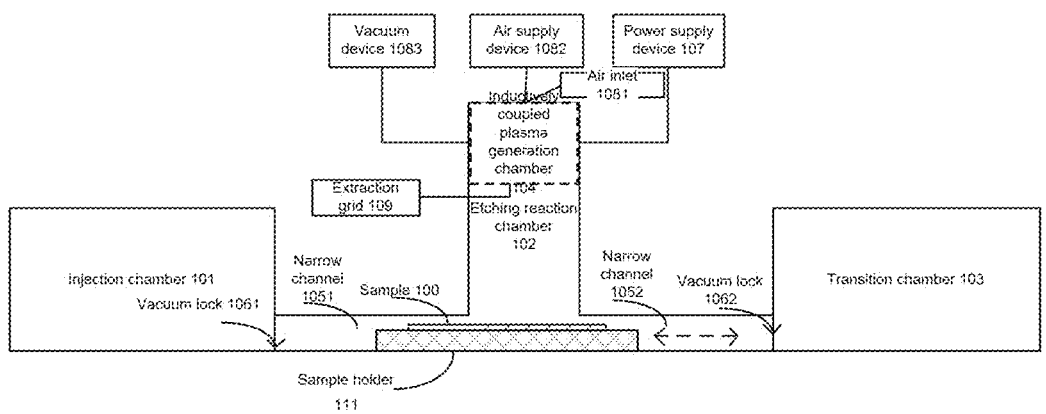
FIG. 6 shows a schematic structural diagram of an ultra-large area scanning inductively coupled plasma etching machine according to an embodiment of the present disclosure.

FIG. 6 shows a schematic structural diagram of an ultra-large area scanning inductively coupled plasma etching machine according to an embodiment of the present disclosure. Those ordinary skilled in the art should understand that the additional technical features of the dry etching apparatuses shown in FIG. 1 to FIG. 4 may also be applied to the ultra-large area scanning inductively coupled plasma etching machine shown in FIG. 6.

Figure 7:
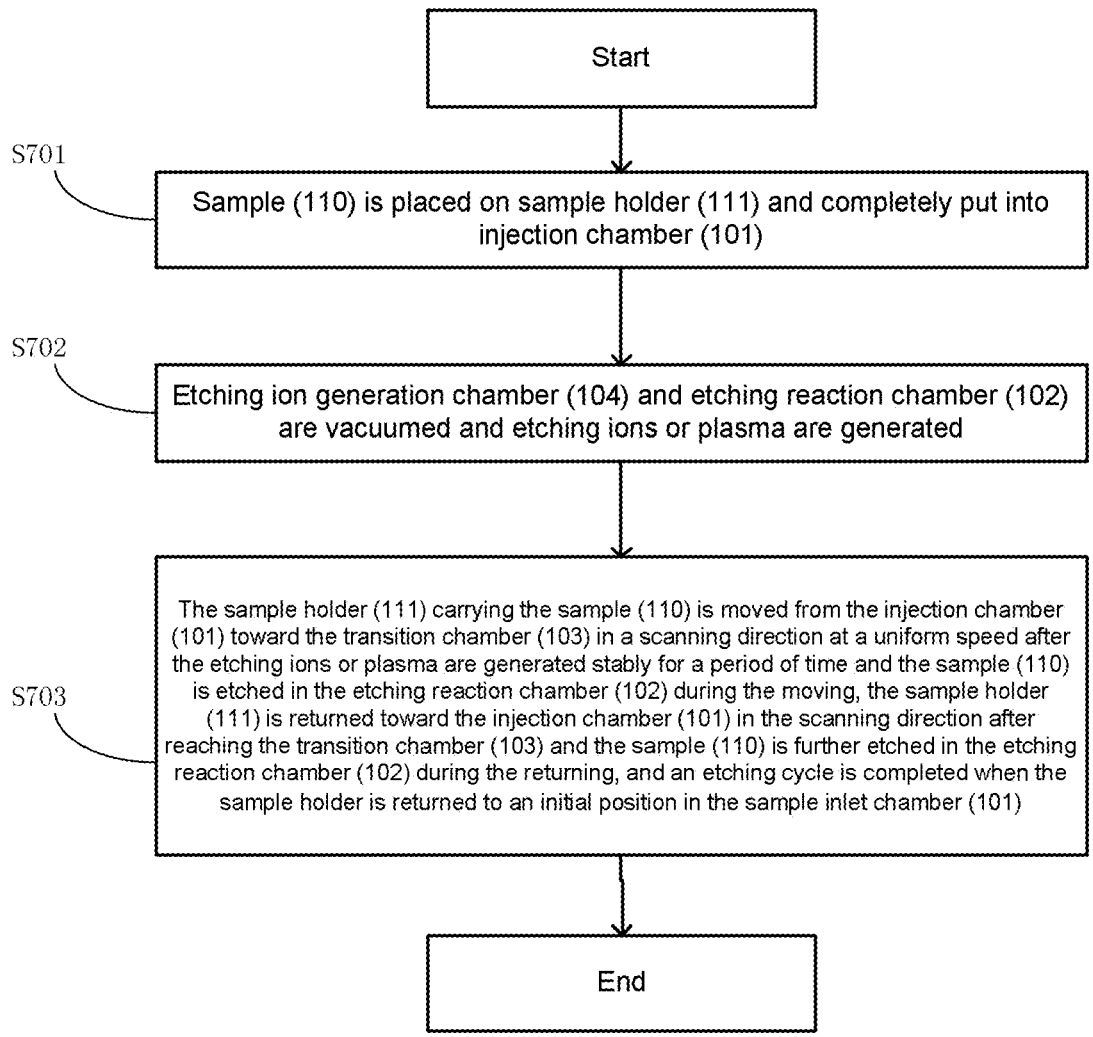
FIG. 7 shows a flowchart of an etching method of an ultra-large area scanning reactive ion etching machine according to an embodiment of the present disclosure.

FIG. 7 shows an etching method of an ultra-large area scanning reactive ion etching machine according to another aspect of the present disclosure. As shown in FIG. 7, the etching method includes following steps. In step S701, a sample (110) is placed on a sample holder (111) and the sample holder (111) is entirely put into an injection chamber (101). In step S702, an etching ion generation chamber (104) and an etching reaction chamber (102) are vacuumed and etching ions or plasma are generated. In step S703, the sample holder (111) carrying the sample (110) is moved from the injection chamber (101) toward a transition chamber (103) in a scanning direction after the etching ions or plasma are generated stably for a period of time, and the sample (110) is etched in the etching reaction chamber (102) during the moving. After the sample holder (111) reaches the transition chamber (103), the sample holder (111) is returned toward the injection chamber (101) in the scanning direction, and the sample (110) is further etched in the etching reaction chamber (102) during the returning. An etching cycle is completed until the sample holder is returned to an initial position in the injection chamber (101).

Optionally, the etching method of the scanning reactive ion etching machine may specifically include following steps. The sample is initially placed on the sample holder and entirely put into the injection chamber. After glow is generated and glow discharges stably for a period of time, the sample holder makes a uniform rectilinear motion in the scanning direction toward the reaction chamber and the etching begins. After the sample holder entirely enters the transition chamber, the sample holder begins to move in a reverse direction and enters the reaction chamber again, and then continues to move until it entirely returns to the initial position in the injection chamber, and then an etching cycle is completed. After one or more cycles of scanning etching are completed, the sample holder contacts with the cooling system in the injection chamber, and the sample is sufficiently cooled during a residence time, and then a new scanning etching process begins.

Figure 8:
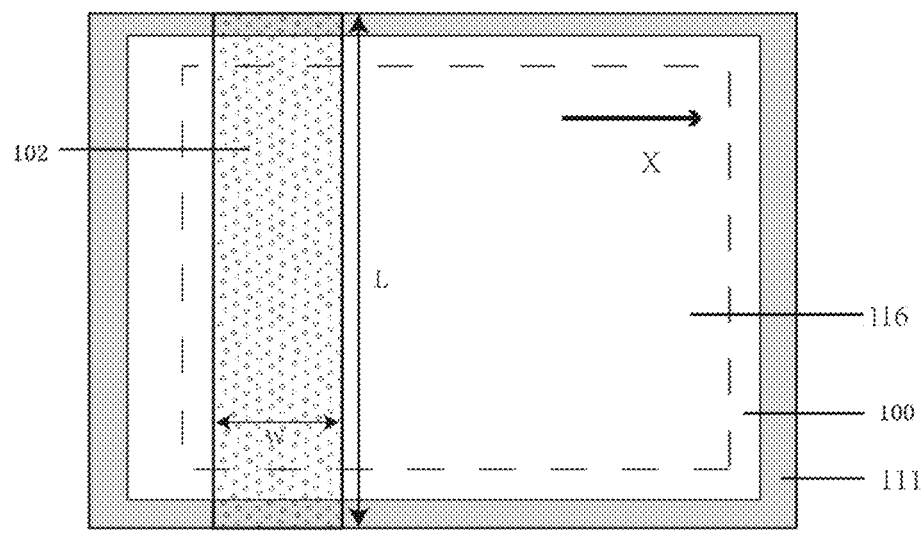
FIG. 8 shows a top view of an ultra-large area scanning etching process according to an embodiment of the present disclosure.
Figure 9:
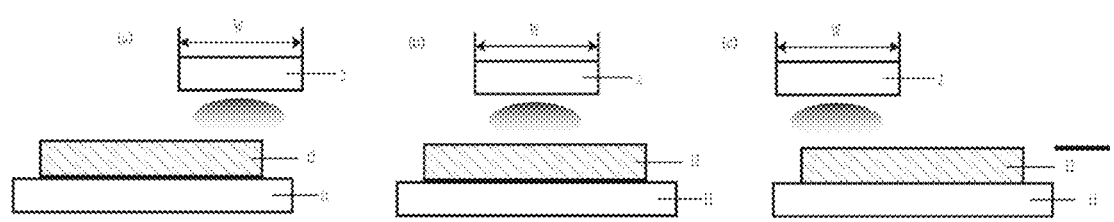
FIG. 9 shows a front view of an ultra-large area scanning etching process according to an embodiment of the present disclosure.

FIG. 8 shows a top view of the scanning etching process according to the embodiments of the present disclosure. FIG. 9 shows a front view of the scanning etching process according to the embodiments of the present disclosure.

Referring to FIG. 8 and FIG. 9, a length L of the etching reaction chamber (102) in the direction perpendicular to the scanning direction is greater than the length of the sample holder (111) in this direction, and a length W of the etching reaction chamber (102) in the direction parallel to the scanning direction is less than the length of the sample holder (111) in this direction. That is to say, an area of the etching reaction chamber (2) parallel to the scanning direction is less than the sample etching area. A pattern etching region 116 shown in FIG. 8 is a region that is in contact with the etching reactive gas in the reaction chamber during the etching process and in that the etching is performed. In order to better understand the present disclosure, the principle of the ultra-large area scanning reactive ion etching machine improving the etching uniformity and increasing the etching area is described in detail below.

Due to the use of the scanning etching method, the etching uniformity in the scanning direction (the sample moving direction) mainly depends on a moving speed of the sample holder and a stability of an etching gas concentration distribution in the scanning direction over time, but has nothing to do with an unevenness of a spatial distribution of the etching gas concentration in the scanning direction. This is because that an etching effect of any point on a certain horizontal line in the scanning direction is equivalent to a sum of integrals of the etching rate of each point on the horizontal line to the residence time. In a case where the scanning speed and the gas flow rate are stable, the concentration distribution of the etching gas on the horizontal line forms a steady state balance, thereby ensuring the etching uniformity in the scanning direction.

Referring to FIG. 8 and FIG. 9, supposing that the etching reaction chamber (102) of the ultra-large area scanning reactive ion etching machine has a length w in the scanning direction, the scanning direction is x direction, and the sample holder is movable at a uniform speed of V. The etching rate of the sample at each point on the horizontal line is associated with a spatial and temporal distribution of gas concentration C(x, t) in the scanning direction, and the etching machine ensures a temporal stability of the gas concentration distribution in an etching cycle, an etching depth d at a certain point on a certain horizontal line in the scanning direction in an etching cycle is:

$$d = \frac{2k}{V} \int_0^w C(x)dx \qquad (1)$$

where k is a constant.

According to Equation (1), the etching depth d at a certain point on a certain horizontal line in the scanning direction in an etching cycle does not change with the x coordinate, that is, the etching depth at each point in the scanning direction is the same.

Therefore, the technical characteristic of the present disclosure resides in that in the scanning direction, the requirement for the spatial uniformity of the gas concentration distribution that affects the uniformity of large-area etching is transformed into the requirement for the temporal stability of the gas concentration spatial distribution and the moving speed of the sample holder, and the requirement for the entire etching stability during the etching is transformed into the requirement for the etching stability in a single cycle. That is to say, either the temporal stability of the gas concentration spatial distribution in the scanning direction and the moving speed of the sample holder, or the temporal stability of the uniformity of the gas concentration spatial distribution in the direction perpendicular to the scanning direction only needs to be kept stable in a single cycle, and fluctuations among cycles are allowed.

According to the present disclosure, the etching method of the traditional etching apparatus where the position of the substrate is fixed during the etching is changed to a mobile scanning etching, the requirement for the two-dimensional etching uniformity in the large-area etching area is transformed into the requirement for the one-dimensional etching uniformity, and the requirement for the stability of the entire etching is reduced to the requirement for the stability in a single scanning period, which greatly reduces the difficulty of device design and manufacturing and the difficulty of process implementation. The present disclosure also changes the traditional large-cavity reaction chamber into a small-cavity reaction chamber (the area of the reaction chamber parallel to the scanning direction is smaller than the sample etching area) by using scanning etching, which further improves the uniformity of gas, reactive ions and active free radicals in the entire cavity. As the volume of the reaction chamber is reduced, the power consumption required for vacuuming and glow discharge is further reduced.

The present disclosure realizes a large-area, uniform and rapid etching, and has broad application prospects in fields of semiconductor manufacturing, large-area liquid crystal panel manufacturing, and large-aperture diffractive optical element preparation.

Although the present disclosure has been specifically shown and described with reference to the typical embodiments of the present disclosure, those ordinary skilled in the art should understand that various changes in form and details may be made to these embodiments without departing from the spirit and scope of the present disclosure defined by the appended claims.

What is claimed is:

1. An ultra-large area scanning reactive ion etching machine, comprising:
    an injection chamber configured to inject a sample, withdraw the sample and buffer an etching process;
    an etching reaction chamber downstream of the injection chamber, and the etching reaction chamber is a reaction cavity configured to etch the sample;
    a transition chamber downstream of the etching reaction chamber and configured to buffer the etching process;
    an etching ion generation chamber in communication with the etching reaction chamber and configured to generate etching ions or plasma, and introduce the etching ions or plasma to the etching reaction chamber,
    wherein the etching reaction chamber is connected to the injection chamber and the transition chamber through channels; and
    a sample holder configured to hold the sample and
    configured to make a uniform rectilinear reciprocating motion among the injection chamber, the etching reaction chamber and the transition chamber in a scanning direction, wherein the machine is configured to etch the sample using the etching ions or plasma in the etching reaction chamber,
    wherein a size of each of the channels in a vertical direction perpendicular to the scanning direction is configured to allow the sample to pass through, and is much smaller than a size of the reaction chamber in the vertical direction perpendicular to the scanning direction,
    wherein a size of each of the channels in the vertical direction perpendicular to the scanning direction is much smaller than a size of each of the channels in the scanning direction,
    wherein in a horizontal direction, a length of the etching reaction chamber perpendicular to the scanning direction is greater than a length of a sample etching region of the sample holder perpendicular to the scanning direction, and a length of the etching reaction chamber parallel to the scanning direction is smaller than a length of the sample etching region of the sample holder parallel to the scanning direction, and
    wherein along the horizontal direction, an area of the etching reaction chamber parallel to the scanning direction is less than an area of the sample etching region.

2. The ultra-large area scanning reactive ion etching machine of claim 1, wherein the etching ion generation chamber is arranged on the etching reaction chamber, and is configured to introduce the etching ions or plasma generated in the etching ion generation chamber to the etching reaction chamber.

3. The ultra-large area scanning reactive ion etching machine of claim 1, wherein the etching ion generation chamber is a discharge chamber for glow discharge so as to generate reactive ions or plasma for etching.

4. The ultra-large area scanning reactive ion etching machine of claim 3, wherein the discharge chamber comprises an upper cover plate provided with an air inlet, the discharge chamber is in communication with an air supply device through the air inlet, and a lower portion of the discharge chamber is connected to the etching reaction chamber through an extraction grid with pores.

5. The ultra-large area scanning reactive ion etching machine of claim 1, wherein the etching ion generation chamber is an inductively coupled plasma generation chamber configured to generate inductively coupled plasma for etching.

6. The ultra-large area scanning reactive ion etching machine of claim 1, wherein a speed of the uniform rectilinear reciprocating motion of the sample holder in the scanning direction is adjustable.

7. The ultra-large area scanning reactive ion etching machine of claim 1, wherein vacuum locks are provided between the etching reaction chamber and the injection chamber, as well as between the etching reaction chamber and the transition chamber.

8. The ultra-large area scanning reactive ion etching machine of claim 1, wherein the etching ion generation chamber and the etching reaction chamber are further connected to a vacuum device to realize and maintain a vacuum state in the etching ion generation chamber and the etching reaction chamber.

9. The ultra-large area scanning reactive ion etching machine of claim 1, wherein the size of the channel is configured to allow the sample to pass through, and a vertical distance between a top of the channel and a surface of the sample is less than $1/10$ of a size of the reaction chamber in the vertical direction.

10. The ultra-large area scanning reactive ion etching machine of claim 9, wherein the etching reaction chamber has an internal height of 100 mm, and the channel has a height of less than 10 mm in a direction perpendicular to the surface of the sample.

11. The ultra-large area scanning reactive ion etching machine of claim 1, wherein in the vertical direction perpendicular to the scanning direction, a size of the injection chamber and/or a size of the transition chamber is greater than or equal to a size of the channel.

12. The ultra-large area scanning reactive ion etching machine of claim 1, wherein the sample holder is arranged on a robot controlled mobile system.

13. The ultra-large area scanning reactive ion etching machine of claim 1, wherein a cooling system is provided in the injection chamber, the cooling system is allowed to take contact with the sample holder to cool the sample.

14. The ultra-large area scanning reactive ion etching machine of claim 1, wherein a micro efficient cooling system is embedded on a back of the sample holder, so as to cool the sample during the scanning etching process.

15. An etching method of the ultra-large area scanning reactive ion etching machine of claim 1, comprising:
- placing the sample on the sample holder and putting the sample holder into the injection chamber entirely;
- vacuuming the etching ion generation chamber and the etching reaction chamber and generating etching ions or plasma;
- moving the sample holder carrying the sample from the injection chamber toward the transition chamber in the scanning direction after the etching ions or plasma are generated stably for a period of time and etching the sample in the etching reaction chamber during the moving, returning the sample holder toward the injection chamber in the scanning direction after the sample holder reaches the transition chamber and further etching the sample in the etching reaction chamber during the returning, and completing an etching cycle until the sample holder is returned to an initial position in the injection chamber.

\* \* \* \* \*